(12) United States Patent
Hiroshima et al.

(10) Patent No.: US 6,624,709 B2
(45) Date of Patent: Sep. 23, 2003

(54) VOLTAGE-CONTROLLED OSCILLATOR AND ELECTRONIC DEVICE USING THE SAME

(75) Inventors: Takashi Hiroshima, Komatsu (JP); Kiyokazu Otani, Komatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/133,360

(22) Filed: Apr. 29, 2002

(65) Prior Publication Data

US 2002/0180541 A1 Dec. 5, 2002

(30) Foreign Application Priority Data

Jun. 1, 2001 (JP) .............................. 2001-167004

(51) Int. Cl.[7] .................................................. H03B 1/00
(52) U.S. Cl. .............................. 331/177 V; 331/117 R; 331/185
(58) Field of Search ................... 331/177 V, 36 C, 331/75, 76, 96, 117 R, 117 FE, 117 D, 179, 185

(56) References Cited

U.S. PATENT DOCUMENTS 3,201,602 A * 8/1965 Norwalt ..................... 307/88.5
4,959,625 A * 9/1990 Kameoka et al. ........... 332/135
5,764,109 A * 6/1998 Kukkonen .................... 331/44

* cited by examiner

*Primary Examiner*—Henry Choe
(74) *Attorney, Agent, or Firm*—Keating & Bennett, LLP

(57) ABSTRACT

A voltage-controlled oscillator includes a varactor diode which is a capacitance element coupled to a resonance circuit. A control voltage is applied to one end of the varactor diode and the output voltage of a variable DC voltage source which is capable of changing a voltage value stepwise is applied to the other end of the varactor diode via a voltage divider. Accordingly, the voltage-controlled oscillator can be operated as a local oscillator used for two communication systems. Further, a switching element is not required and thus deterioration in the characteristics caused by a reduction in the Q factor of the resonance circuit can be prevented. In addition, the power consumption does not increase.

20 Claims, 2 Drawing Sheets

VOLTAGE-CONTROLLED OSCILLATOR AND ELECTRONIC DEVICE USING THE SAME

BACKGROUND OF THE INVENTION

1. Field of the Invention

The present invention relates to voltage-controlled oscillators and electronic devices including the same. More specifically, the present invention relates to a voltage-controlled oscillator provided in a cellular phone that utilizes a plurality of communication methods, and to an electronic device including the same.

2. Description of the Related Art

In a communication system, such as a cellular phone system, each communication method and each communication carrier usually occupies different frequency bands. In order for the communication system to operate in different frequency bands, a voltage-controlled oscillator defining a local oscillator for the communication device must operate in a plurality of frequency bands such that the intermediate frequencies are the same.

The following methods have been provided to make the voltage-controlled oscillator usable for a plurality of frequency bands.

(1) Providing a plurality of voltage-controlled oscillators, each having a different oscillation frequency, and the voltage-controlled oscillators are switched for each frequency band.

(2) Integrating a switching element, such as a diode or a transistor, in a resonance circuit of one voltage-controlled oscillator and the resonance frequency of the resonance circuit is switched by turning on/off the switching element.

In method (1), however, the cost increases because a plurality of voltage-controlled oscillators is provided and the miniaturization of communication devices cannot be achieved because a large circuit board is required.

Also, in method (2), problems arise in that providing the switching element increases in the number of components and the cost, and that the size of the circuit board must be increased. Further, the series resistance of the switching element reduces the Q factor of the resonance circuit, thereby deteriorating the C/N characteristic of the oscillation signal. In addition, current must be applied to the switching element, which results in an increase in power consumption.

SUMMARY OF THE INVENTION

In order to overcome the above-described problems, preferred embodiments of the present invention provide a voltage-controlled oscillator which operates in a plurality of frequency bands and which reduces the cost of the oscillator, decreases the size of a circuit board, prevents deterioration in the Q factor of the resonance circuit, and decreases power consumption, and also provide an electronic device including such a novel voltage controlled oscillator.

The voltage-controlled oscillator according to a preferred embodiment of the present invention includes an active oscillation element, a resonance circuit connected to the active oscillation element, a varactor diode defining a capacitance element coupled to the resonance circuit, whereby the oscillation frequency of the voltage-controlled oscillator is changed substantially continuously by substantially continuously changing a DC control voltage applied to one end of the varactor diode. The voltage-controlled oscillator further includes a variable DC voltage source that stepwise changes a voltage value. The output of the variable DC voltage source is applied to the other end of the varactor diode.

The voltage-controlled oscillator preferably further includes a voltage divider including at least two resistors connected in series, one end of the voltage divider being connected to the variable DC voltage source and the other end being connected to a reference voltage source. The voltage-division junction or node of the voltage divider is connected to the other end of the varactor diode.

Preferably, the voltage-division junction of the voltage divider is connected to the anode of the varactor diode.

An electronic device according to another preferred embodiment the present invention includes the above-described voltage-controlled oscillator.

With this arrangement, the voltage-controlled oscillator according to preferred embodiments of the present invention is used for a plurality of frequency bands while decreasing the cost and size of the oscillator. Further, a reduction in the Q factor of the resonance circuit and an increase in power consumption of the oscillator are prevented.

Further, in the electronic device according to preferred embodiments of the present invention, cost reduction and miniaturization are achieved.

Other features, elements, characteristics and advantages of the present invention will become more apparent from the following detailed description of preferred embodiments with reference to the drawings thereof.

DETAILED DESCRIPTION OF PREFERRED EMBODIMENTS

Figure 1:
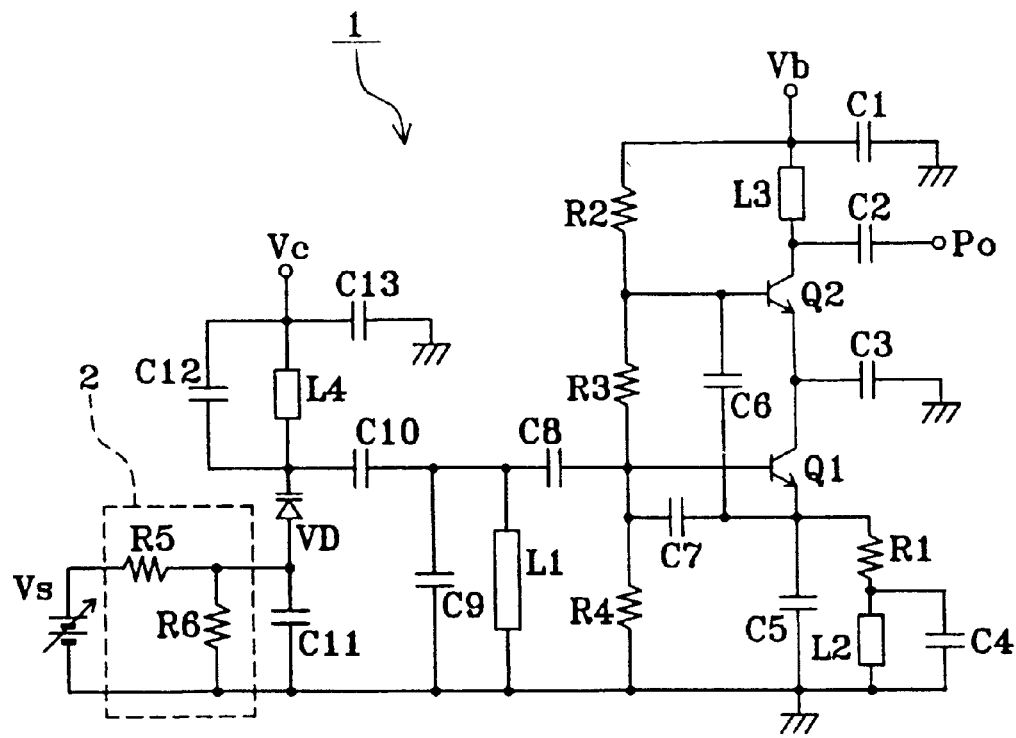
FIG. 1 is a circuit diagram showing a preferred embodiment of a voltage-controlled oscillator of the present invention.

FIG. 1 shows a circuit diagram of a preferred embodiment of a voltage-controlled oscillator of the present invention. In FIG. 1, the voltage-controlled oscillator 1 includes active elements defined by transistors Q1 and Q2, capacitors C1 to C13, resistors R1 to R6, inductance elements L1 to L4, a varactor diode VD, a variable DC voltage source Vs, and a power terminal Vb.

The power terminal Vb is grounded via the capacitor C1 and is connected to the collector of the transistor Q2 via the inductance element L3. The collector of the transistor Q2 is connected to the an output terminal Po via the capacitor C2 and the emitter thereof is grounded via the capacitor C3 and is connected to the collector of the transistor Q1. The emitter of the transistor Q1 is grounded via the capacitor C5 and is also grounded via the resistor R1 and the inductance element L2. The capacitor C4 is connected in parallel to the inductance element L2. Further, the power terminal Vb is grounded via the resistors R2, R3, and R4, the junction between the resistors R2 and R3 is connected to the base of the transistor Q2, and the junction between the resistors R3 and R4 is connected to the base of the transistor Q1. The emitter of the transistor Q1 is connected to the base of the transistor Q2 via the capacitor C6. Further, the base and the emitter of the transistor Q1 are connected via the capacitor C7.

Additionally, the base of the transistor Q1 is connected to one end of the inductance element L1 via the capacitor C8. The other end of the inductance element L1 is grounded. The capacitor C9 is connected in parallel to the inductance element L1. The one end of the inductance element L1 is connected to the cathode of the varactor diode VD via the capacitor C10. The anode of the varactor diode VD is grounded via the capacitor C11. The cathode of the varactor diode VD is connected to the control terminal Vc via a parallel circuit including the inductance element L4 and the capacitor C12. The control terminal Vc is grounded via the capacitor C13.

One end of a voltage divider 2 including the resistors R5 and R6, which are connected in series, is connected to the variable DC voltage source Vs and the other end thereof is grounded to a ground which defines a reference voltage source. The voltage-division junction of the voltage divider 2, that is, the junction between the resistors RS and R6, is connected to the anode of the varactor diode VD.

The inductance elements L1 to L4 are defined by a microstrip line provided on a circuit board or by a strip line provided in a multilayer circuit board.

In the voltage-controlled oscillator 1 arranged in the above-described manner, the transistor Q1 is an active element for oscillation and operates such that the collector of the transistor Q1 is HF-grounded via the capacitor C3. The transistor Q1 oscillates via a resonance circuit including the inductance element L1 connected to the base of the transistor Q1 via the capacitor C8 and outputs an oscillation signal from the emitter. The oscillation signal output from the emitter of the transistor Q1 is input to the base of the transistor Q2 via the capacitor C6. The transistor Q2 is an active element acting as a buffer amplifier and operates such that the emitter of the transistor Q2 is HF-grounded via the capacitor C3. The transistor Q2 outputs an oscillation signal from the collector to the output terminal Po.

The varactor diode VD, which is a capacitance element, is connected to the one end of the inductance element L1 via the capacitor C10 so as to function as a portion of the resonance circuit. The cathode of the varactor diode VD is connected to the control terminal Vc via the inductance element L4, a control voltage applied to the control terminal Vc changes the junction capacitance of the varactor diode VD, thereby changing the resonance frequency of the resonance circuit. As a result, the oscillation frequency of the voltage-controlled oscillator 1 is changed. As the control voltage applied to the control terminal Vc, a signal output from a loop filter of a PLL circuit is provided, for example.

The voltage is varied substantially continuously, and thus, the oscillation frequency of the voltage-controlled oscillator 1 is varied substantially continuously.

Incidentally, the potential of the anode of the varactor diode VD must be switched from one to another of a plurality of arbitrary fixed values such that the junction capacitance of the varactor diode VD varies in a plurality of variation ranges which do not overlap each other, by one control-voltage source whose value varies from a first arbitrary value to a second arbitrary value. To achieve this, the variable DC voltage source Vs and the voltage divider 2 are provided. That is, since the voltage-division junction of the voltage divider 2 is connected to the anode of the varactor diode VD, the voltage of the anode is a divided voltage of the output voltage of the variable DC voltage source Vs. Therefore, by setting the output voltage of the variable DC voltage source Vs to a plurality of values in a stepwise manner, in other words, digitally, the potential of the anode of the varactor diode VD can be set to a plurality of values in a stepwise manner, in other words, digitally. Accordingly, the variation range of the voltage applied to both ends of the varactor diode VD when the control voltage is varied from the minimum value to the maximum value while maintaining the anode voltage at a fixed value (that is, the variation range of the junction capacitance of the varactor diode VD) does not overlap the variation range of the voltage applied to both ends of the varactor diode VD when the control voltage is varied from the minimum value to the maximum value by switching the anode voltage to another fixed value (that is, the variation range of the junction capacitance of the varactor diode VD). This will be described below with a specific example.

Figure 2:
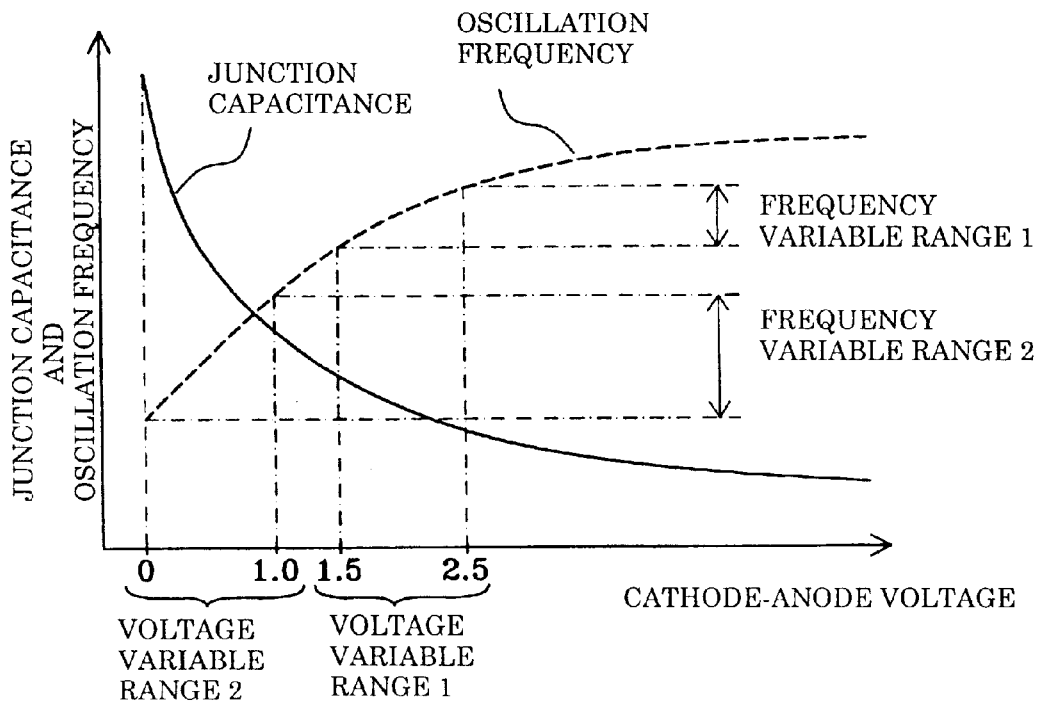
FIG. 2 is a characteristic view showing the relationship between the cathode-anode voltage of a varactor diode, and the junction capacitance and the oscillation frequency in the voltage-controlled oscillator shown in FIG. 1.

FIG. 2 shows the relationship between the cathode-anode voltage of the varactor diode VC, and its junction capacitance and the oscillation frequency of the voltage-controlled oscillator 1. The operation of the voltage-controlled oscillator 1 is described in detail with reference to this figure.

First, the output voltage of the variable DC voltage source Vs is set to 0 V and the voltage at the voltage-division junction of the voltage divider 2 is set to 0 V, thereby setting the anode voltage of the varactor diode VD to 0 V. In this state, the control voltage to be applied to the control terminal Vc is varied within the range of about 1.5 V to about 2.5 V. In this case, the cathode-anode voltage of the varactor diode VD varies within the range of about 1.5 V to about 2.5 V (voltage variable range 1), the junction capacitance varies accordingly, and the oscillation frequency of the voltage-controlled oscillator 1 varies accordingly (frequency variable range 1).

Subsequently, the output voltage of the variable DC voltage source Vs is switched so as to set the voltage at the voltage-division junction of the voltage divider 2, that is, the anode voltage of the varactor diode VD, to about 1.5 V. In this state, the control voltage to be applied to the control terminal Vc is varied within the range of about 1.5 V to about 2.5 V. In this case, the cathode-anode voltage of the varactor diode VD varies within the range of about 0 V to about 1.0 V (voltage variable range 2), the junction capacitance varies accordingly, and the oscillation frequency varies accordingly (frequency variable range 2).

The frequency variable range 1 does not overlap the frequency variable range 2 because the voltage variable range 1 does not overlap the voltage variable range 2. Furthermore, the frequency variable range 1 is higher than the frequency variable range 2. Accordingly, if the frequency band of the voltage-controlled oscillator required for two communication systems is within the frequency variable range 1 and the frequency variable range 2, one voltage-controlled oscillator 1 can be effective used for the two communication systems.

As described above, the voltage-controlled oscillator 1 defines a local oscillator which is utilized for two communication systems by applying the output of the variable DC voltage source Vs, which can change the voltage value stepwise, to one end of the varactor diode which controls the oscillation frequency generated by the control voltage applied to the other end. Furthermore, deterioration in the characteristics caused by a reduction in the Q factor of the resonance circuit is prevented and the power consumption is greatly decreased.

In the above-described preferred embodiment of the present invention, the voltage value of the variable DC voltage source is changed in two stages. However, the voltage value may be changed in three stages.

Also, in the above-described preferred embodiment of the present invention, the control voltage is applied to the cathode of the varactor diode and the voltage of the variable DC voltage source is applied to the anode thereof. However, the control voltage may be applied to the anode and the voltage of the variable DC voltage source may be applied to the cathode.

Figure 3:
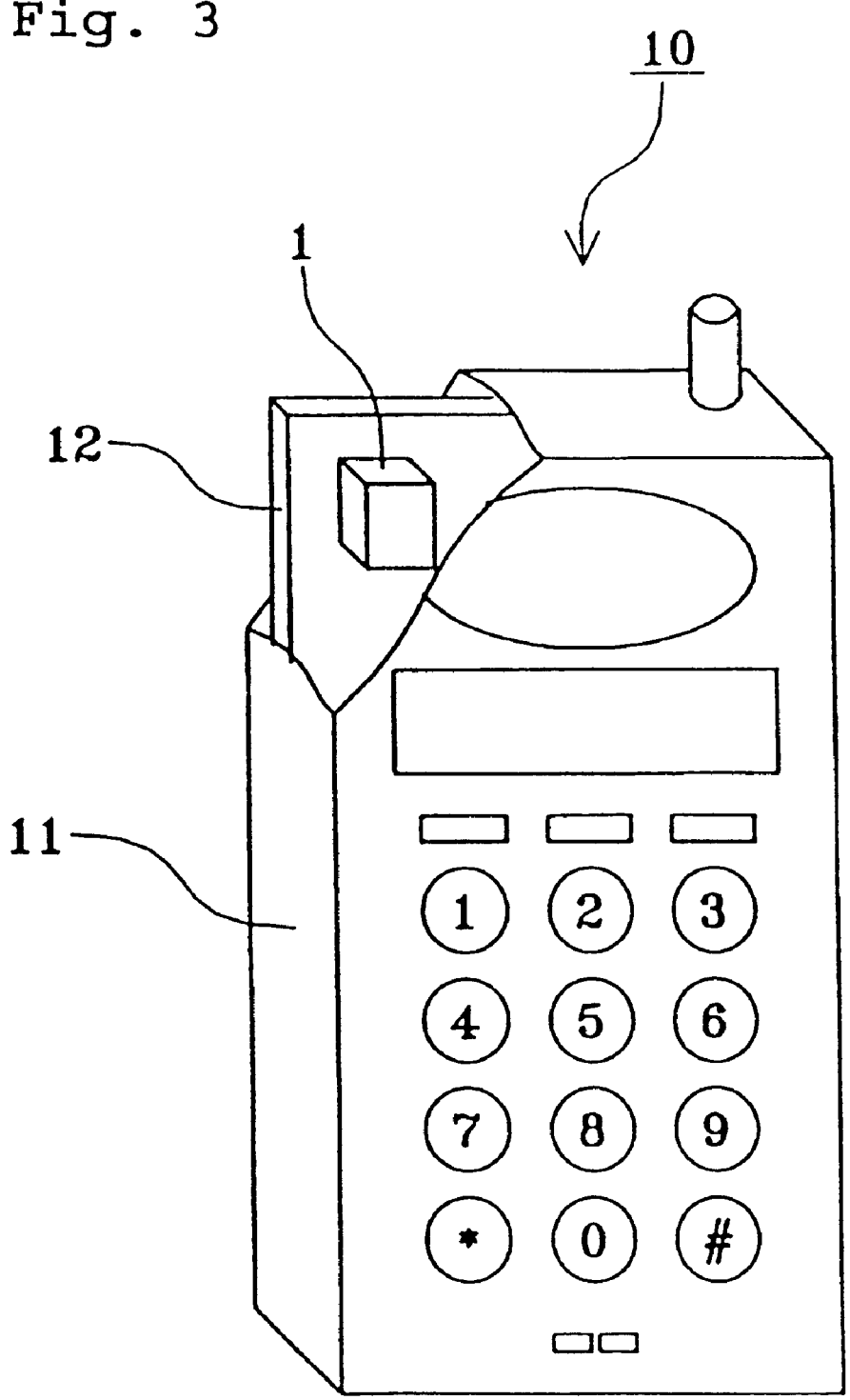
FIG. 3 is a perspective view showing a preferred embodiment of an electronic device of the present invention.

FIG. 3 is a perspective view showing a preferred embodiment of an electronic device according to the present invention. In FIG. 3, a cellular phone, which is an example of an electronic device, includes a case 11, a printed circuit board 12 provided therein, and the voltage-controlled oscillator 1 according to the preferred embodiment of the present invention mounted on the printed circuit board 12.

The cellular phone 10 including the voltage-controlled oscillator 1 according to the preferred embodiment of the present invention is used for two communication methods, although only one voltage-controlled oscillator 1 is used. Accordingly, substantial cost reduction and miniaturization are achieved.

Although the cellular phone is shown as the electronic device in FIG. 3, the electronic device is not limited to the cellular phone, and any suitable electronic device can be provided with the voltage-controlled oscillator according to the preferred embodiment of the present invention.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A voltage-controlled oscillator comprising:
   an active oscillation element;
   a resonance circuit connected to the active oscillation element;
   a varactor diode defining a capacitance element coupled to the resonance circuit, such that the oscillation frequency of the voltage-controlled oscillator is changed substantially continuously by substantially continuously changing a DC voltage applied to one end of the varactor diode; and
   a variable DC voltage source for changing a voltage value in a stepwise manner, and the output of the variable DC voltage source is connected to the other end of the varactor diode.

2. The voltage-controlled oscillator according to claim 1, further comprising a voltage divider which includes at least two resistors connected in series, one end of the voltage divider being connected to the variable DC voltage source and the other end being connected to a reference voltage source, wherein a voltage-division junction of the voltage divider is connected to the other end of the varactor diode.

3. The voltage-controlled oscillator according to claim 2, wherein the voltage-division junction of the voltage divider is connected to an anode of the varactor diode.

4. The voltage-controlled oscillator according to claim 1, wherein said active oscillation element includes at least one transistor.

5. The voltage-controlled oscillator according to claim 4, wherein a collector of the at least one transistor is connected to an output terminal of the resonance circuit via a capacitor, and an emitter of the at least one transistor is grounded via another capacitor.

6. The voltage-controlled oscillator according to claim 1, wherein the resonance circuit includes inductance elements defined by a microstrip line.

7. The voltage controlled oscillator according to claim 6, wherein said active oscillation element includes a first transistor and a second transistor, a collector of the first transistor is grounded via a first capacitor, one of said inductance elements is connected to a base of the first transistor, an emitter of the first transistor is connected to a base of the second transistor via a second capacitor, said second transistor defines a buffer amplifier, an emitter of the second transistor is grounded via a third capacitor, and an oscillation signal is output from a collector of the second transistor to an output terminal of the resonance circuit.

8. The voltage-controlled oscillator according to claim 6, wherein the varactor diode is connected to one end of one of the inductance elements via a capacitor.

9. The voltage-controlled oscillator according to claim 1, wherein the DC voltage is substantially continuously changed from about 0 V to about 2.5 V.

10. An electronic device comprising the voltage-controlled oscillator according to claim 1.

11. A voltage-controlled oscillator comprising:
    an active oscillation element;
    a resonance circuit connected to the active oscillation element;
    a varactor diode defining a capacitance element coupled to the resonance circuit; and
    a variable DC voltage source for changing a voltage value in a stepwise manner, and the output of the variable DC voltage source is connected to the other end of the varactor diode; wherein
    the oscillation frequency of the voltage-controlled oscillator is substantially continuously changed in response to the changing voltage values of the variable DC voltage source.

12. The voltage-controlled oscillator according to claim 11, further comprising a voltage divider which includes at least two resistors connected in series, one end of the voltage divider being connected to the variable DC voltage source and the other end being connected to a reference voltage source, wherein a voltage-division junction of the voltage divider is connected to the other end of the varactor diode.

13. The voltage-controlled oscillator according to claim 12, wherein the voltage-division junction of the voltage divider is connected to an anode of the varactor diode.

14. The voltage-controlled oscillator according to claim 11, wherein said active oscillation element includes at least one transistor.

15. The voltage-controlled oscillator according to claim 14, wherein a collector of the at least one transistor is connected to an output terminal of the resonance circuit via a capacitor, and an emitter of the at least one transistor is grounded via another capacitor.

16. The voltage-controlled oscillator according to claim 11, wherein the resonance circuit includes inductance elements defined by a microstrip line.

17. The voltage controlled oscillator according to claim 16, wherein said active oscillation element includes a first transistor and a second transistor, a collector of the first transistor is grounded via a first capacitor, one of said inductance elements is connected to a base of the first transistor, an emitter of the first transistor is connected to a base of the second transistor via a second capacitor, said second transistor defines a buffer amplifier, an emitter of the second transistor is grounded via a third capacitor, and an oscillation signal is output from a collector of the second transistor to an output terminal of the resonance circuit.

18. The voltage-controlled oscillator according to claim 16, wherein the varactor diode is connected to one end of one of the inductance elements via a capacitor.

19. The voltage-controlled oscillator according to claim 11, wherein the DC voltage is substantially continuously changed from about 0 V to about 2.5 V.

20. An electronic device comprising the voltage-controlled oscillator according to claim 11.

\* \* \* \* \*